United States Patent

Costello

[15] 3,655,173

[45] Apr. 11, 1972

[54] CONVEYOR FOR FUSING AND HEATING SYSTEMS

[72] Inventor: Bernard J. Costello, Ringoes, N.J.

[73] Assignee: Argus Engineering Company, Inc., Hopewell, N.J.

[22] Filed: July 13, 1970

[21] Appl. No.: 54,446

[52] U.S. Cl. ....................263/8, 219/388

[51] Int. Cl. ....................F27b 9/24

[58] Field of Search ....................263/8; 219/388

[56] References Cited

UNITED STATES PATENTS

| | | | |
|---|---|---|---|
| 1,583,046 | 5/1926 | Ingle | 263/8 |
| 1,532,017 | 3/1925 | Wry | 263/8 |

*Primary Examiner*—John J. Camby

*Attorney*—Ostrolenk, Faber, Gerb & Soffen

[57] ABSTRACT

Apparatus for heating and fusing platings provided upon printed circuit boards and the like. The boards are moved by conveyor means through one or more infrared energy sources arranged at spaced intervals on one or both sides of the boards and adapted to focus radiant energy on the board surfaces, preferably in the form of elongated line images. The conveyor system moves the boards through the plurality of radiant energy sources which heat and fuse the particles of the plating. The conveyor system is comprised of an open-weave mesh belt wherein the "strands" of the belt are provided with bent portions or projections which support the boards being heated a spaced distance above the plane of the belt to substantially eliminate the "shadow effect" caused by the belt which is interposed between the infrared energy sources and the surface of the boards being heated.

4 Claims, 3 Drawing Figures

INVENTOR.
BERNARD J. COSTELLO
BY
Ostrolenk, Faber, Gerb & Soffen
ATTORNEYS

CONVEYOR FOR FUSING AND HEATING SYSTEMS

The present invention relates to radiant energy sources and more particularly to a novel conveyor for use in heating and fusing systems whereby the belt is provided with bent portions or projections to support the printed circuit boards and the like above the plane of the conveyor to substantially eliminate the shadow effect caused by the conveyor belt.

BACKGROUND

There exist numerous applications in which it is required to heat electrical components. For example, it is frequently necessary to plate printed wiring boards with a suitable alloy cover exposed copper conductors provided on the boards. Such platings enhance shelf life of the boards prior to component assembly, and facilitate examination of plated and fused printed wiring boards to determine their quality and potential reliability.

One system for rapidly and reliably fusing of plating on printed wiring boards is set forth in detail in copending application, Ser. No. 872,917, filed Oct. 31, 1969 and assigned to the assignee of the present invention. The system described in the cited copending application employs focused infrared heating devices arranged to irradiate respective opposing surfaces of printed wiring boards which are moved past the infrared heating devices by conveyor means. The elongated focused line images act to heat and fuse the platings provided on the printed wiring boards in a predetermined fashion. Such apparatus, when used to heat both sides of the printed wiring boards simultaneously, provides a more than double heating rate without overheating the laminate. The system preferably uses an open-weave mesh conveyor to enable simultaneous heating of both sides of the printed wiring boards. However, the strands of the conveyor have a significant effect upon the heating profile developed by the infrared energy sources due to the shadow effect created by the strands of the conveyor which are interposed between the infrared energy sources and the surface of the printed wiring board which the sources irradiate.

The present invention is characterized by providing an open-weave mesh conveyor which has integrally formed bent portions or projections for supporting the printed wiring boards (or other like components) a spaced distance above the plane of the conveyor so as to substantially eliminate the "shadow effect."

The conveyor belt of the present invention, in one preferred embodiment, is comprised of a closed loop conveyor belt structure entrained about driving and driven roller means for moving items to be irradiated through the region of influence of the radiant energy. The conveyor is of an open-weave mesh design comprised of a plurality of individual strands of relatively rigid wire, which strands are bent or otherwise formed into an undulated configuration so as to interlock with adjacent strands positioned on opposite sides thereof. Selected strands of the conveyor, which are located at spaced intervals from one another, are provided with additional bent or curved portions, which additional portions extend upward and away from the plane of the conveyor for support purposes. The additional bent or curved portions are arranged at randomly spaced intervals along the selected strands so as to support the items being irradiated a spaced distance above the plane of the conveyor. For example, considering those systems in which the conveyor supports printed wiring boards and the like on its upper surface so as to move the boards through the region of influence of radiant energy emitted from one or more radiant energy sources positioned beneath the open-weave conveyor, the upwardly bent portions or projections are so positioned as to support the printed wiring boards (on at least three projections) a spaced distance above the plane of the conveyor to thereby eliminate the shadow effect which would otherwise be created by the strands of the conveyor as a result of the close proximity of the strands relative to the confronting surface of the printed wiring boards being heated. The bends or projections which serve to support the printed wiring boards have an inverted substantially V-shaped configuration so as to greatly reduce the surface contact between the printed wiring boards and the supporting projections. By maintaining the printed wiring boards a spaced distance above the plane of the conveyor and simultaneously moving the printed wiring boards through the region of influence of the radiant energy source (or sources), substantially the entire surface of the printed wiring board is exposed to uniform radiant energy since the printed wiring boards are moved through the region of influence of the radiant energy causing the irradiation, when integrated over the time interval of exposure, to be substantially uniform. This arrangement, coupled with the fact that the shadow effect of the strands is substantially eliminated, provides excellent control over the degree of radiation and therefore the level of heating experienced by the components being irradiated.

Insofar as existing methods are concerned, printed wiring boards are usually supported only along their edges. This requires that the supporting surfaces of the conveyor be adjustable in width to accommodate different sizes of circuit boards. Also, the board must be very accurately placed to bear only on its edges.

The advantages of random point supports are such that the boards may be randomly dropped or placed upon the supporting projections as long as the random distribution or projections provides a minimum of three projections for support. This makes the loading fool proof and thereby reduces the level of skill required to operate the apparatus.

It is, therefore, one object of the present invention to provide a novel conveyor system for use in heating and fusing apparatus wherein the conveyor system employed is comprised of an open-weave mesh conveyor belt having means for supporting the items being irradiated a spaced distance above the plane of the conveyor to provide substantially uniform heating over the entire surface being irradiated.

This, as well as other objects of the present invention will become apparent when reading the accompanying description and drawings in which.

Figure 1:
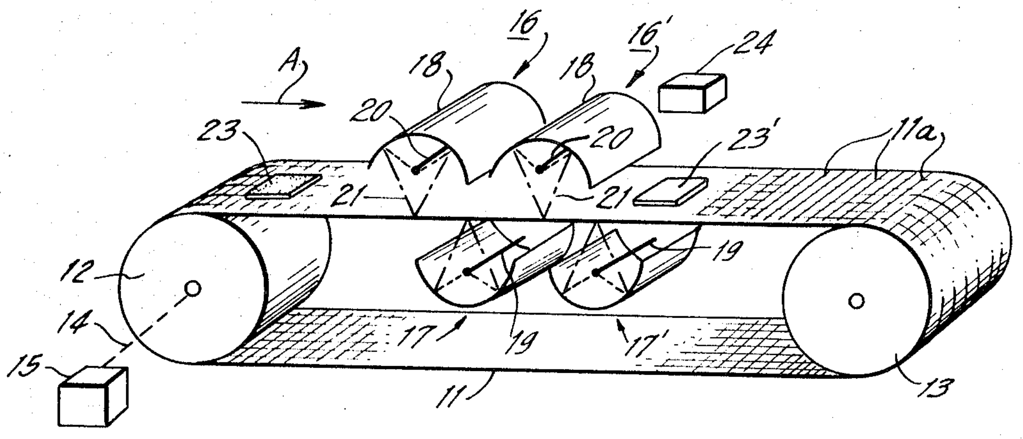
FIG. 1 is an elevational view showing heating and fusing apparatus employing a conveyor system designed in accordance with the principles of the present invention.

FIG. 1 shows apparatus 10 for performing a heating and fusing operation and is comprised of a closed loop conveyor belt 11 of an open-mesh metallic construction which is entrained about a pair of elongated rollers 12 and 13 mounted to rotate about their longitudinal axes. A drive motor 15 is mechanically coupled by suitable means shown in dotted fashion and designated by numeral 14 (which may, for example, be a motor output shaft) for driving roller 12 which, in turn, moves conveyor belt 11 in the direction shown by arrow A. Roller 13 is preferably mounted in a free-wheeling manner whereby rotation is imparted to driven roller 13 as a result of the movement of conveyor 11 which is entrained about the rollers 12 and 13. The spacing between rollers 12 and 13 is chosen to maintain the conveyor substantially flat in the region between the rollers. If desired, the rollers may be replaced by rotatably mounted sprockets which mesh with the conveyor along its marginal edges.

A plurality of focused infrared heating devices 16 and 16' are positioned above conveyor 11 while a plurality of similar focused infrared heating devices 17 and 17' are positioned beneath the top surface of conveyor 11. Each of the heating devices 16–17' is comprised of a reflector member 18 which may preferably have an elliptical shaped cross-sectional configuration and be provided with a concave surface which is highly reflective to infrared radiation.

A "line" source of infrared radiation 19 is aligned so as to be coincident with the primary focus of the reflector whereby infrared rays 20 emitted from each line source and impinging upon the concave reflective surface of its associated reflector, are reflected as shown by rays 21 to create an image focal line which is a line image substantially equal to the length and dimensions of the "line" radiation sources 19. The image focuses are positioned so as to lie to either one side or the other of the confronting surface of the printed wiring boards 23 and 23' supported by the conveyor. It is desirable to offset the image relative to the surface being heated to achieve a broader line of radiation in the direction of travel. The intention in defocusing is to provide for more uniform heating of the surface and to increase the surface area exposed to radiation at any given instant. This will be made more apparent from a consideration of FIG. 3 as will be set forth below.

Arrow A represents the direction of the travel of conveyor 11. The items to be heated such as, for example, a printed wiring board 23, is positioned upon the left-hand end of conveyor 11 so as to pass between and thereby come under the influence of the infrared heating devices 16–17'. Each of the sources produce an elongated line of radiation which is oriented in a direction transverse to the direction of travel of the conveyor. Thus, the printed wiring board 23 sequentially passes series of focused lines of radiation developed by each of the heating devices and ultimately passes beyond the last of the groups of heating devices until reaching a position shown by printed wiring board 23'. The sequencing of the heating devices may be adjusted as to power level and as to spacing intervals between adjacent heating devices in order to yield different effects in the end result of the heating operation.

The heating devices are normally continuously energized and the conveyor 11 is moved continuously by energized motor means 15. In fusing operations for printed wiring boards, the boards are preferably coated with a liquid flux placed upon the conveyor in a horizontal plane. The conveyor carries each board between the groups of heating systems at a preset speed whereby the plating is melted and fused to the printed wiring board surfaces. A typical linear speed may, for example, be 5 ft. per minute.

Once the boards reach the position occupied by printed wiring board 23', they may be removed from the conveyor and either washed or stacked for further processing. The adjustability of spacing intervals between the heating devices and their individual power levels enable any desired heating profile to be obtained.

Selected "strands" **11*a*** are provided with upwardly bent portions or projections which are arranged at relatively small spaced intervals for the purpose of supporting each of the printed wiring boards a spaced distance D above the plane of the conveyor to thereby significantly enhance the uniform heating of the bottom surfaces of the printed wiring boards. By maintaining the bottom surfaces of the printed wiring boards a spaced distance above the plane of the conveyor, the "shadow effect" created by the "strands" of the conveyor is substantially eliminated.

Figure 2:
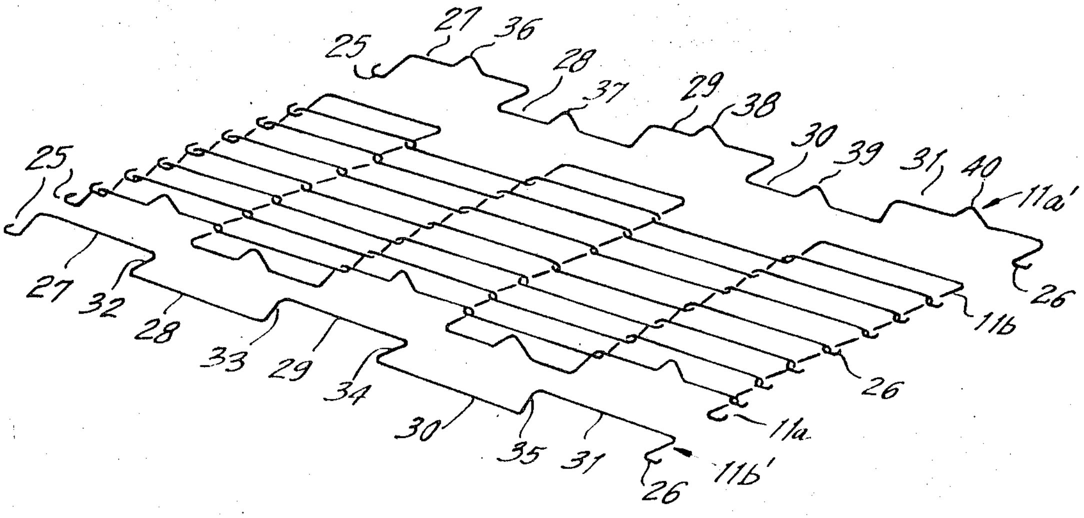
FIG. 2 is a perspective view showing a portion of the conveyor of the present invention in greater detail.

FIG. 2 is a perspective view showing a portion of the conveyor in greater detail. The conveyor 11 is comprised of a plurality of individual strands of a substantially rigid metallic wire **11*b*. Each of the wires 11*b* is bent to form an undulating or a serpentine configuration. Considering wire 11*b'*, for example, the ends thereof are bent to form hook-shaped configurations 25 and 26. The intermediate portion of strand 11*b'* is provided with a plurality of substantially straight portions 27–31 whereby the straight portions 28 and 30 are offset from the straight portions 27, 29 and 31 by integrally formed bent sections 32–35. Straight portions 28 and 30 are substantially colinear. Each of the strands 11*b* (and 11*b'*) are arranged to be snap-fitted into adjacent strands so as to interlock therewith in the manner shown in FIG. 2**.

As was previously described, selected strands **11*a* are arranged at spaced intervals along the conveyor and are of a similar configuration so as to be interfitted with adjacent strands 11*b*. Each of the selected strands 11*a* (such as, for example, 11*a'*) is substantially identical to the strands 11*b* in that they are each provided with hook-shaped portions 25 and 26 at their ends, with colinear straight line portions 27, 29 and 31 and with colinear portions 28 and 30 which are offset from straight portions 27, 29 and 31 by bent sections 32, 33, 34 and 35, which integrally join all of the straight line portions 27–31. However, in addition thereto, the selected strands 11*a* are further provided with additional bent sections 36–40, which bent portions have an inverted substantially V-shaped configuration and are provided at locations intermediate the ends of each of the straight line portions 27–31. The selected strands 11*a* (and 11*a'*) are interfitted with adjacent strands 11*b* in the same manner as the strands 11*b***, whereby each strand is easily and readily interlocked with adjacent strands on opposite sides thereof.

When fully assembled, the bent or curved portions 36–40 of each of the selected strands **11*a* project generally in an upward direction for the purpose of positioning and supporting objects placed upon the conveyor a spaced distance above the plane of the conveyor. Measured lengthwise along the distance of travel of the conveyor, the selected strands 11*a* may be positioned approximately 2 to 2.5 inches apart. Obviously, any other spacing intervals may be employed, especially in applications wherein the objects to be supported by portions 26–40 are relatively small. In addition thereto, less than one or two or more bent portions of the type designated by the numerals 37–40 may be provided along the length of each of the straight line portions 27–31 to respectively provide a smaller or greater spacing density of the projections in a direction measured transverse to the direction of travel of the conveyor. Obviously, the conveyor may be formed exclusively of strands of the selected type 11*a* in applications wherein the devices to be radiated are of relatively small size in order to be assured that such devices or objects will be maintained and supported a spaced distance above the plane of the conveyor. Whereas the individual "strands" 11*a* and 11*b* are substantially rigid, the conveyor is actually quite flexible enabling the conveyor to easily follow the contour of the conveyor rollers 12 and 13 (or sprockets, for example). The strands 11*a* and 11*b*** need not be highly rigid and also need not be formed from metal so long as the actual material used yields the requisite support and flexibility and is able to withstand the elevated temperatures without being damaged thereby.

Figure 3:
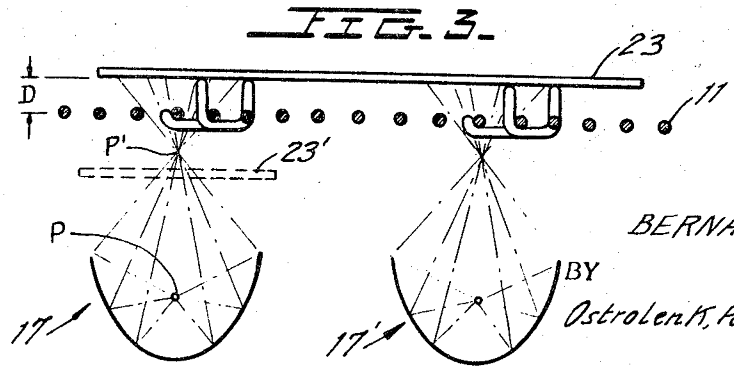
FIG. 3 is an elevational view of the apparatus of FIG. 1.

As shown best in FIG. 3, the elevated position of printed wiring board 23 above the plane of conveyor 11 substantially eliminates the "shadow effect" which the individual strands might otherwise create in the case where the printed wiring board is in direct contact with the strands at substantially the level of the plane of the conveyor. In addition, since the conveyor and the printed wiring board continuously moves past each of the heating devices 17 and 17', the angle of incidence of the focused rays 21 varies continuously so that the total radiation experienced by any portion of the undersurface of the printed wiring board during the period of time in which that portion of the surface of the printed wiring boards is exposed to any one of the infrared heating devices will be substantially uniform thereby assuring uniform irradiation and therefore uniform heating of the surface of the printed wiring board exposed to the heating devices 17 and 17'. The inverted substantially V-shaped configuration of the support portions 36–40 of selected strands **11*a*** provides minimum surface contact between the selected strands and the confronting surface of the object being heated so as to further assure substantially uniform heating of the entire surface area of the printed wiring board. Optimally, the number of supporting projections should be selected so as to be commensurate with the sizes of the object being heated in order to minimize the amount of surface contact between the strands of the conveyor and the surface being supported while at the same time being assured that the supporting sections which maintain the surface being supported are spaced closely enough so as to assure that the entire surface of the object being heated will be maintained a spaced distance above the plane of the conveyor.

It should be understood that the actual configuration of each strand of the conveyor may vary greatly so long as the final design yields an open-mesh weave to assure that the maximum amount of radiant energy will pass through the conveyor. The projections provided on the strands of the conveyor may also take a variety of forms so long as the function of supporting the object to be irradiated is maintained and further so long as the actual surface contact between the projections and the surface being supported is minimized. As one example, the supporting portions may take the form of single short strands of wire joined at one end thereof at spaced intervals along the strands 11*b* and projecting generally upward to provide a supporting surface or point for supporting the object to be positioned thereon. The upper free ends of the small short sections of wire may preferably be tapered to reduce the amount of surface contact between the supporting short sections of wire and the object being supported.

As another alternative, the relative positioning of conveyor 11 and heating devices 17 may be such as to position the confronting surface of the printed wiring board in the region between the image focus and the primary focus. Note FIG. 3 which shows that the conveyor 11 may be positioned relative to heating devices 17 and 17' such that the confronting surface of board 23' (shown in dotted fashion) lies in the region between the primary focus P and the image focus P'.

Although there has been described a preferred embodiment of this novel invention, many variations and modifications will now be apparent to those skilled in the art. Therefore, this invention is to be limited, not by the specific disclosure herein, but only by the appending claims.

The embodiments of the invention in which an exclusive privilege or property is claimed are defined as follows:

1. Conveyor means for supporting objects and linearly moving the supported objects through a region wherein the objects are treated comprising:

a conveyor belt formed of a plurality of strands which are adapted to interlock with one another to form an open-weave mesh structure whereby the openings formed in the plane of said conveyor occupy a greater portion of the surface area of the plane of said conveyor than the surface area occupied by said strands;

a plurality of projections being provided on at least selected ones of said strands for supporting the objects placed upon said conveyor a spaced distance above the plane of said conveyor to minimize the amount of surface contact between said conveyor and the surface of the objects being supported and by said conveyor;

means for linearly moving said conveyor through the region wherein the objects are to be treated;

said conveyor strands each being comprised of elongated wire shaped members bent in an undulating fashion;

each of said strands being interlocked with adjacent strands to form said conveyor;

each of said selected strands being further bent to form substantially inverted V-shaped configurations which project upwardly from the plane of said conveyor for supporting the objects being treated a spaced distance above the plane of said conveyor.

2. A method for uniformly heating the surface of a planar member comprising the steps of:

supporting the planar member by at least three randomly distributed points of support;

moving the planar member in a linear manner;

providing a source of radiant energy;

focusing the radiant energy along substantially a line image which is aligned transverse to the movement of the planar member;

moving the planar member through the region of influence of said radiant energy so as to expose that surface of the planar member confronting the radiant energy source along an imaginary plane which is displaced from the focal image of the radiant energy source.

3. The method of claim 2 wherein the step of providing a radiant energy source is comprised of providing at least two such radiant energy sources positioned on opposite sides of the plane of movement of said planar member;

focusing the radiant energy emitted from said radiant energy sources so as to form two focal images of the radiant energy source whereby the associated confronting surfaces of the moving planar member lie in imaginary planes, each of which are displaced from the image focuses of the radiant energy sources confronting the opposing surfaces.

4. Conveyor means for supporting objects and linearly moving the supported objects through a region wherein the objects are treated comprising:

a conveyor belt formed of a plurality of strands which are adapted to interlock with one another to form an open-weave mesh structure whereby the openings formed in the plane of said conveyor occupy a greater portion of the surface area of the plane of said conveyor than the surface area occupied by said strands;

a plurality of projections being provided on at least selected ones of said strands for supporting the objects placed upon said conveyor a spaced distance above the plane of said conveyor to minimize the amount of surface contact between said conveyor and the surface of the objects being supported and by said conveyor;

means for linearly moving said conveyor through the region wherein the objects are to be treated;

at least one heating device positioned beneath said conveyor for producing an elongated heating zone aligned transverse to the direction of movement of said conveyor whereby said heating zone is directed toward the bottom surface of the object supported by said projections which are adapted to maintain the said surface a spaced distance above the plane of said conveyor to assure substantially uniform exposure of the entire bottom surface of said object to said heat zone;

said heating device being comprised of:

a source of radiation lying within the short wave length visible and near infrared range;

reflector means for focusing radiation from said source impinging upon said reflector upon an associated surface of a device to form a narrow, elongated zone of radiation impinging upon each device as it is moved along the conveyor.

* * * * *